United States Patent [19]

Lohrmann

[11] 4,027,231
[45] May 31, 1977

[54] BATTERY CHARGE INDICATOR

[75] Inventor: Dieter R. Lohrmann, Lanham, Md.

[73] Assignee: The United States of America as represented by the Secretary of the Army, Washington, D.C.

[22] Filed: Sept. 17, 1975

[21] Appl. No.: 614,715

[52] U.S. Cl. .............................. 324/29.5; 320/48; 324/133; 340/249
[51] Int. Cl.² .................................... G01N 27/42
[58] Field of Search ............ 324/21, 96, 29.5, 72.5, 324/123 R, 133; 340/248 B, 249; 320/48

[56] References Cited

UNITED STATES PATENTS

| | | | |
|---|---|---|---|
| 2,745,094 | 5/1956 | Harrington | 340/249 |
| 3,157,870 | 11/1964 | Mariano et al. | 320/48 |
| 3,487,295 | 12/1969 | Nocera et al. | 324/29.5 |
| 3,796,951 | 3/1974 | Joseph | 324/133 |

OTHER PUBLICATIONS

R. J. Fritz, "Indicating Lamp System for Diagnostic Measurement", IBM Technical Disclosure Bulletin, vol. 16, No. 9, Feb. 1974, pp. 2841-2842.

Primary Examiner—Stanley T. Krawczewicz
Assistant Examiner—Michael J. Tokar
Attorney, Agent, or Firm—Nathan Edelberg; Frank J. Dynda; Jeremiah G. Murray

[57] ABSTRACT

A battery charge indicator for determining the remaining useful life of a battery which accurately measures the battery voltage in an operational environment and provides an indicator of relative levels of the operational condition of the battery and a proportional measurement of its expected life utility. The device employs solid state circuit elements for compactness, which include a Zener diode as a reference voltage element coupled to a voltage divider network and a plurality of amplifiers connected to an array of separate indicators such as light emitting diodes, which indicate particular battery voltage. A thermistor network may be included to provide compensation for temperature variations of the operational environment of the battery and load.

3 Claims, 2 Drawing Figures

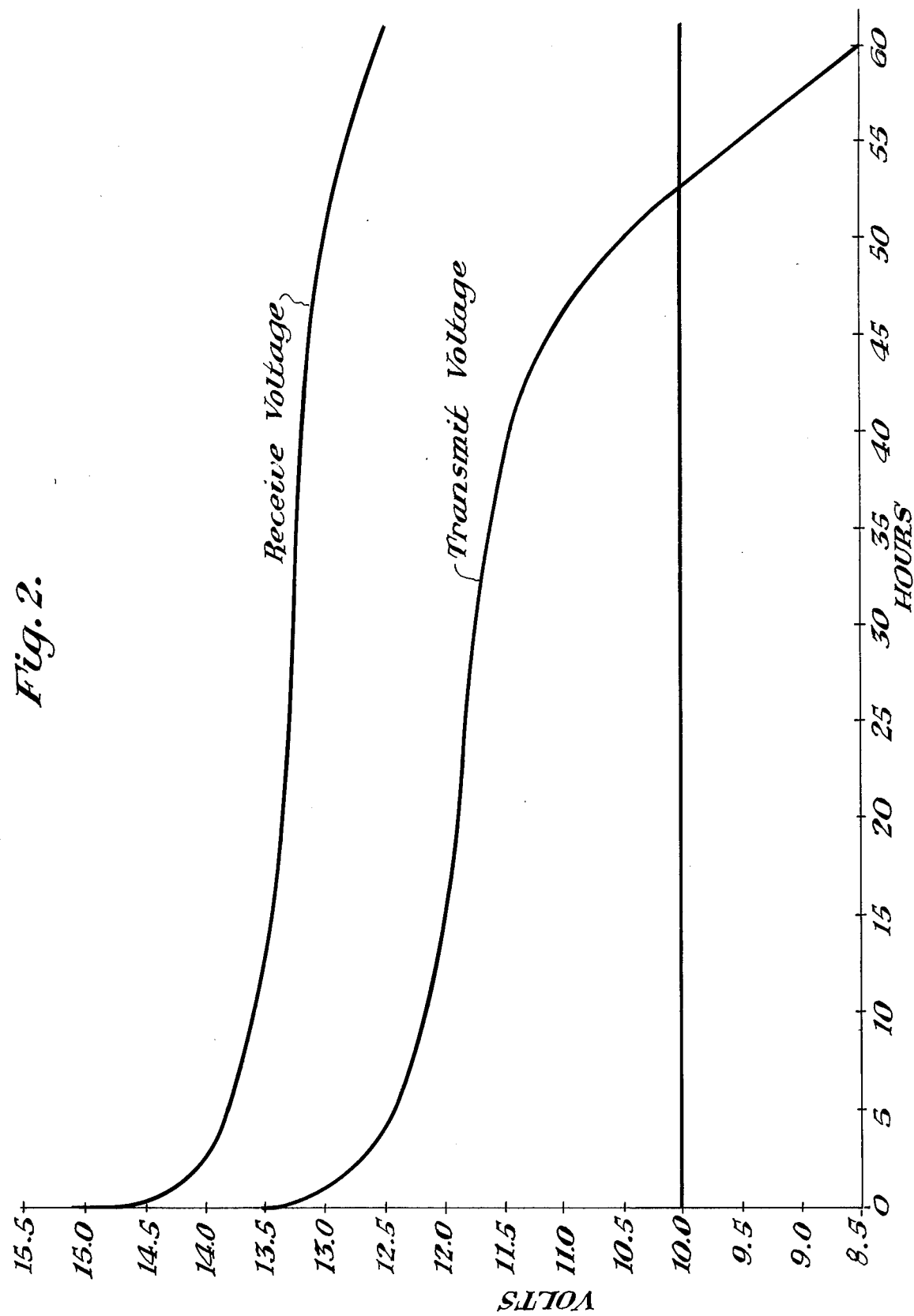

BATTERY CHARGE INDICATOR

The invention described herein may be manufactured and used by or for the Government for governmental purposes without the payment of any royalties thereon or therefor.

BACKGROUND OF THE INVENTION

This invention relates generally to a battery charge indicator, and specifically to a device for determining the remaining useful life in a operational envvironment while the battery is connected to the load.

In many applications of electrical equipment, such as military, medical and the like, equipment operational readiness is a primary consideration. A problem with battery powered equipmeent has been determining the useful remaining life of the battery. With the use of some of the newer batteries, whose lifetime may be from 50 to 80 hours, it is difficult for an operator to accurately and consistently determine equipment on time and therefore impossible to determine in all situations whether or not a battery should be replaced. A specific example would be field employment of a battery powered radio in the military. The instant invention provides a device which will allow an operator to determine with relative accuracy the expected life of the battery so that the operator would know whether or not to replace the battery in a particular operational load. The device is especially useful for battery powered radios which are commonly found in military or other communication oriented environments. With the use of the instant invention, premature replacement of batteries will be eliminated or reduced, resulting in reduced cost of equipment operation.

BRIEF DESCRIPTION OF THE INVENTION

A battery charge indicator for determining the useful remaining life of a battery in an operational environment comprising a pair of terminals for connecting across the battery, a voltage divider network, a reference voltage means connected to said voltage divider network, said voltage divider network including a plurality of branches including resistive means, amplifying means coupled to said voltage divider network and a plurality of current flow indicating means coupled across said voltage divider branches and said terminals. In one embodimment, the reference voltage is provided by a Zener diode which allows current flow to the indicators above a predetermined voltage threshold, said reference voltage value being selected for the particular load in which it shall be employed to. Using three indicators in one example, the device may include three small light emitting diodes (LED), with each light emitting diode being coupled to a particular branch of the voltage divider network. Also coupled to the voltage divider network is a plurality of amplifiers such as transistors which amplify the signal to the light emitting diode, with one transistor in each branch of the voltage divider network.

The principle of operation of the instant invention is based on the fact that the remaining useful life of a battery can be determined as a function of the voltage output of the battery while it is in operation while connected to the load to which it provides power. Such an application may be found with a battery powered radio such as the U.S. Military AN/PRC 77. The internal impedance of the battery, which rises with rising discharge time, is found to be a good indicator which, when applied to a radio, provides the most effective measurement of battery voltage during transmitter actuation. It is essential that the output voltage of the battery, during operation of the radio or similar load, be measured accurately, with circuit element values being chosen for particular operating loads and batteries. In one embodiment, utilizing a three element indicator system, the circuit is designed such that three elements lighted indicate more than five-sixths of the battery useful life remains, two elements lighted between five-sixths and one-half of the battery life remains, one indicator element lighted between one-half to one-sixth battery life remains, and no indicator elements lighted less than one-sixth of the battery life remains.

The device may be mounted permanently to the load to provide monitoring of the battery each time the load is used. The use of the instant invention would not require removal of the battery, as do some conventional battery testers. In operation, battery voltage is received in the voltage branch network which includes a plurality of resistors of varying values, with each branch being coupled across a separate indicator. A thermistor network is included to take into account variation of battery voltage discharge over a wide temperature range. The voltage driving each LED is derived by comparing the battery voltage across each branch with a standard voltage achieved in the circuit with a Zener diode.

BRIEF DESCRIPTION OF THE DRAWINGS

FIG. 2 shows a graph of a typical battery life test which measures the discharge voltage versus the operating hours of the battery which is computed for an AN/PRC 77 radio at 25° C.

PREFERRED EMBODIMENT OF THE INVENTION

Figure 1:
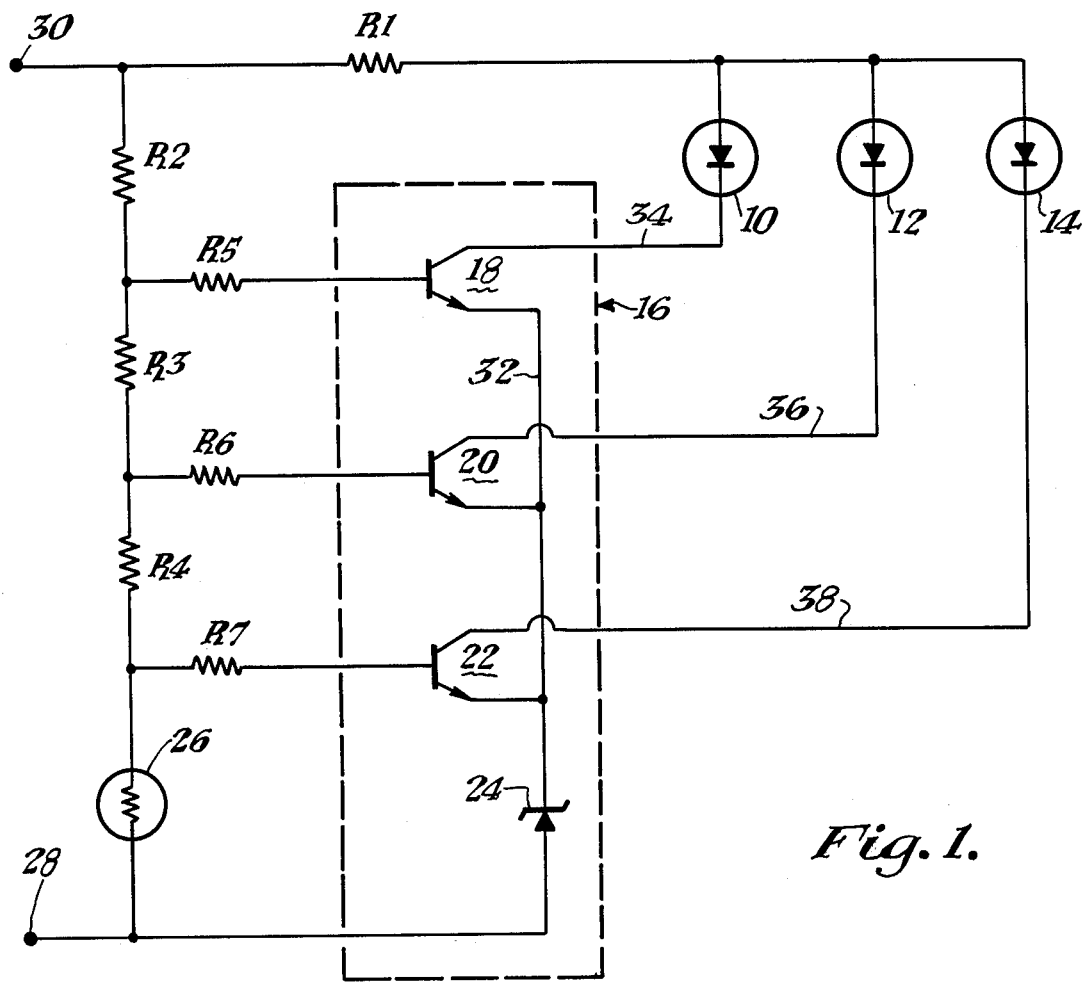
FIG. 1 shows a schematic diagram of one embodiment of the instant invention.

Referring now to the drawings and especially FIG. 1, the instant invention is shown in one embodiment comprising a pair of input contacts 28 and 30 which are coupled to the battery leads to measure battery discharge while the load is in operation. In this specific example, the load is an AN/PRC-77 radio with the input contacts coupled across the power plug. The present device includes a plurality of indicators such as light emitting diodes 10, 12, and 14 coupled in series with resistor R1 and current amplifier/switching transistors 18, 20 and 22 to ground potential. Resistor R1 provides current limiting for LED'S 10, 12 and 14. The voltage dividing network of resistors R2 through R7, thermistor 26 and Zener diode 24 provide the appropriate "turn on" current of the above series circuit. The light emitting diodes are connected to the circuitry in such a way that the number of diodes illunimated provide information relative to the discharge voltage of the battery.

A voltage divider network is comprised of resistors R2, R3, R4 which are connected to branch resistors R5, R6 and R7 which provide different voltages to an amplifying network 16 having transistors 18, 20 and 22 which are coupled to different branches of the voltage divider network. The emitter of each transistor 18, 20, and 22 is connected to conductor 32 which is coupled to the Zener diode 24, the Zener diode acting as a reference voltage source. No current will flow in the circuit if the input voltage from the battery is less than the reference voltage. Connected to the voltage divider network is a thermistor network 26 which is selected to provide varying resistance as a function of the environmental temperature of the device.

Each light emitting diode 10, 12 and 14 is connected to the collector leads 34, 36 and 38 of a different transistor 18, 20, and 22 respectively, with each transistor having its base coupled to a separate voltage divider branch. The resistance values selected for the voltage divider network will determine the turn-on voltage for each of the light emitting diodes. When the voltage of the battery being tested is near its maximum state, the voltage will illuminate all three LED's.

The resistor divider network is utilized to establish the turn-on voltages. The transistors 18, 20 and 22 provide a current through LED's 10, 12 and 14 respectively which is directly proportional to the voltage difference between the branch circuit voltages (base of transistors) and the Zener diode 24 voltage. The transistor base voltage must be greater than 7.7 volts in this embodiment to allow current flow. As the battery voltage at contact 30 decreases, the respective base emitter voltages drop successively to zero, turning transistors 18, 20 and 22 off. The transistors interrupt the flow of current through LED'S 10, 12 and 14 indicating the progressive discharge of the battery and therefore battery life remaining.

The number of light emitting diodes can be varied, with additional branches added to the circuit, if desired. Other indicators could be used in place of the light emitting diodes; however, in the present embodiment, the use of the light emitting diodes in conjunction with an integrated circuit allows the device to be quite small and utilize a negligible amount of current.

FIG. 2 shows a graph of an actual test of battery life as employed with an AN/PRC-77 radio, during receiver and transmitter actuation, the voltage being the discharge voltage of the battery in different operable states as a function of hours of service life of the battery. Since the slope of each curve from zero hours to approximately 40 hours of battery life is quite shallow, it is imperative for the proper operation of the instant invention that the battery discharge voltage be measured very accurately. The accuracy of the instant invention is achieved by a Zener diode which creates the reference voltage in conjunction with the resistor divider network to establish the turn-on voltage of each of the light emitting diodes. In the present embodiment, the illumination of three lights indicates a substantially full battery charge, two lights indicate more than one-half but less than full, one light indicates more than one-sixth but less than one-half.

The present invention may be permanently mounted to a radio such that whenever the radio is keyed, the device will be automatically activated, thus providing an operational reading to the radio operator of the battery condition each time the load is utilized. Since the device is constructed on miniaturized circuitry, the addition of the instant invention to a radio will occupy a limited space while the current drain for actuating the device will be negligible.

The instant invention has now been shown and described herein in what is considered to be the most practical and preferred emmbodiment. It is recognized, however, that departures may be made therefrom within the scope of the invention and that obvious modifications will occur to a person skilled in the art.

What I claim is:

1. A battery life indicator comprising:
   a battery having a known battery voltage versus battery life characteristic;
   a voltage divider permanently connected to said battery including a plurality of preselected resistors and at least one thermistor;
   a plurality of transistors the bases of which are connected through preselected base resistors to different points on said voltage divider, and the emitters of which are all connected to a common point on a reference voltage element; and
   a plurality of light emitting diodes having the anodes connected in common and thence connected through a current limiting resistance to one end of said voltage divider, and wherein the cathodes of said light emitting diodes are each connected to a different collector of said plurality of transistors, wherein said preselected voltage divider resistors, said voltage divider points, said base resistors, said thermistor, said voltage reference element, and said current limiting resistor are selected in accordance with said battery voltage versus battery life characteristic in order that the number of lighted light emitting diodes indicates a predetermined battery life remaining.

2. A battery life indicator as in claim 1 wherein three illuminated light emitting diodes indicate full battery life remaining, two illuminated light emitting diodes indicate greater than one half but less than full life remaining, and one illuminating light emitting diode indicates more than one sixth battery life remaining but less than one half battery life remaining.

3. A battery life indicator as in claim 1 wherein said voltage reference element comprises a Zener diode.

* * * * *